United States Patent
Jourdan et al.

(10) Patent No.: US 11,414,318 B2
(45) Date of Patent: Aug. 16, 2022

(54) MICROELECTRONIC STRUCTURE WITH VISCOUS DAMPING CONTROLLED BY CONTROLLING A THERMO-PIEZORESISTIVE EFFECT

(71) Applicants: COMMISSARIAT À L'ÉNERGIE ATOMIQUE ET AUX ÉNERGIES ALTERNATIVES, Paris (FR); SAFRAN ELECTRONICS & DEFENSE, Boulogne Billancourt (FR)

(72) Inventors: Guillaume Jourdan, Grenoble (FR); Guillaume Lehee, Boulogne Billancourt (FR)

(73) Assignees: COMMISSARIAT A L'ÉNERGIE ATOMIQUE ET AUX ENERGIES ALTERNATIVE, Paris (FR); SAFRAN ELECTRONICS & DEFENSE, Boulogne Billancourt (FR)

( * ) Notice: Subject to any disclaimer, the term of this patent is extended or adjusted under 35 U.S.C. 154(b) by 147 days.

(21) Appl. No.: 16/471,378

(22) PCT Filed: Dec. 22, 2017

(86) PCT No.: PCT/FR2017/053812
§ 371 (c)(1),
(2) Date: Jun. 19, 2019

(87) PCT Pub. No.: WO2018/115786
PCT Pub. Date: Jun. 28, 2018

(65) Prior Publication Data
US 2019/0330050 A1    Oct. 31, 2019

(30) Foreign Application Priority Data
Dec. 22, 2016    (FR) ...................................... 1663255

(51) Int. Cl.
*B81B 3/00* (2006.01)
*B81B 7/02* (2006.01)
(Continued)

(52) U.S. Cl.
CPC .......... *B81B 3/0045* (2013.01); *B81B 3/0024* (2013.01); *B81B 7/02* (2013.01);
(Continued)

(58) Field of Classification Search
CPC .... B81B 2201/0235; B81B 2201/0271; B81B 2201/031; B81B 2203/05;
(Continued)

(56) References Cited

U.S. PATENT DOCUMENTS 9,209,746 B2 * 12/2015 Phan Le .................. H03B 5/30
2008/0068000 A1 * 3/2008 Bargatin .............. G01N 29/036
29/25.01
(Continued)

OTHER PUBLICATIONS

Electronics Tutorials, Potentiometers (Year: 2016).*
(Continued)

*Primary Examiner* — David L Singer
(74) *Attorney, Agent, or Firm* — Pearne & Gordon LLP

(57) ABSTRACT

Microelectronic structure comprising at least one movable mass that is mechanically connected to a first mechanical element by a first mechanically linking connector and to a second mechanical element (24) by electrically conductive second mechanically linking connector, and a device for electrically biasing the second mechanically linking connector, the second mechanically linking connector being such that they are the seat of a thermo-piezoresistive effect, the second linking connector and the movable mass being placed with respect to each other so that a movement of the movable mass applies a mechanical stress to the second linking connector, wherein the electrically biasing device are (Continued)

DC voltage biasing device and form, with at least the second mechanically linking connector, a thermo-piezoresistive feedback electric circuit.

15 Claims, 6 Drawing Sheets

(51) Int. Cl.
    *G01L 1/18*             (2006.01)
    *G01P 1/00*            (2006.01)

(52) U.S. Cl.
CPC .............. *G01L 1/183* (2013.01); *G01P 1/003* (2013.01); *B81B 2201/0235* (2013.01); *B81B 2201/0271* (2013.01); *B81B 2201/031* (2013.01); *B81B 2203/05* (2013.01)

(58) Field of Classification Search
CPC ............ B81B 2203/051; B81B 3/0024; B81B 3/0045; B81B 3/0086; B81B 7/02; G01L 1/18; G01L 1/183; G01P 1/003; G01P 15/0802; G01P 15/123; G01P 2015/0817; G01P 2015/0882; H03H 3/0072; H03H 9/02338; H03H 9/02448; H03H 9/2452
See application file for complete search history.

(56) References Cited

U.S. PATENT DOCUMENTS

| | | | | |
|---|---|---|---|---|
| 2010/0219893 | A1* | 9/2010 | Duraffourg | H03B 5/323 331/55 |
| 2010/0219895 | A1* | 9/2010 | Duraffourg | H03B 5/323 331/108 C |
| 2011/0025426 | A1* | 2/2011 | Steeneken | H03H 9/02259 331/155 |
| 2011/0193449 | A1* | 8/2011 | Phan Le | G01C 19/56 310/317 |
| 2013/0285676 | A1* | 10/2013 | Rahafrooz | G01N 15/10 324/633 |
| 2017/0059420 | A1 | 3/2017 | Rey et al. | |
| 2017/0117825 | A1 | 4/2017 | Jourdan et al. | |
| 2017/0314973 | A1 | 11/2017 | Leoncino | |
| 2018/0179081 | A1 | 6/2018 | Jourdan et al. | |
| 2018/0183404 | A1 | 6/2018 | Jourdan et al. | |
| 2018/0327253 | A1 | 11/2018 | Jourdan et al. | |

OTHER PUBLICATIONS

A Self-sustained Nanomechanical Thermal-piezoresistive Oscillator with Ultra-Low Power Consumption, 978-1-4799-8001-7/14/ © 2014 IEEE (Year: 2014).*
International Search Report for PCT/FR2017/053812 dated Feb. 15, 2018.
Written Opinion for PCT/FR2017/053812 dated Feb. 15, 2018.
French Search Report for French Application No. 16 63255 dated Aug. 30, 2017.
Leheé, Guillaume et al. "Low Power Damping Control of a Resonant Sensor Using Back Action in Silicon Nanowires" In: IEEE Xplore Digital Library, Feb. 29, 2016, pp. 99-102.
Rahafrooz, Amir et al. "Fully Micromechanical Piezo-Thermal Oscillators" In: IEEE International Electron Devices Metting, Dec. 6, 2010 pp. 7.2.1-7.2.4.
Steenekan, P.G. et al. "Piezoresistive Heat Engine and Refrigerator" In: NXP-TSMC Research Center Nov. 6, 2011, pp. 1-13.
Yucetas, Mikail et al. "A Charge Balancing Accelerometer Interface with Electrostatic Damping" In: IEEE, 2011, pp. 291-294.

* cited by examiner

MICROELECTRONIC STRUCTURE WITH VISCOUS DAMPING CONTROLLED BY CONTROLLING A THERMO-PIEZORESISTIVE EFFECT

CROSS-REFERENCE TO RELATED APPLICATIONS

This is a National Stage application of PCT international application PCT/FR2017/053812, filed on Dec. 22, 2017, which claims the priority of French Patent Application No. 16 63255, filed Dec. 22, 2016, both of which are incorporated herein by reference in their entireties.

TECHNICAL FIELD AND STATE OF PRIOR ART

The present invention relates to microelectromechanical structures and nanoelectromechanical structures with a controlled viscous damping by controlling the thermo-piezoresistive effect.

Microelectromechanical systems (MEMS) and nanoelectromechanical systems (NEMS) comprise a fixed part and at least one movable mass being movable with respect to a substrate able to be vibrated under the effect of an external stimulus, forming a resonator.

A mechanical resonator or oscillator disposed in a gaseous environment undergoes a damping due to gas friction upon moving the movable mass, called a viscous damping.

Controlling mechanical energy damping or dissipation processes in a resonator enables the bandpass of MEMS and NEMS to be increased by reducing the time interval necessary to restore the balance with the external medium. More generally, controlling the bandpass of a mechanical resonator can be exploited to make tunable bandpass filters. Finally, compensation for the viscous damping forces, via such controlling, can lead the system into self-oscillation. This propriety can be exploited to make electromechanical oscillators.

Controlling the viscous damping is an efficient means to modify the electromechanical response of a MEMS/NEMS structure: the mechanical behaviour of a microsystem subjected to an external stimulus can be deeply redefined either in terms of response time to reach its steady state, sensitivity to disturbances close to the resonance frequency, or ability to make a self-oscillating system.

Several solutions exist to modify this viscous damping to which the resonator is subjected.

Indeed, the vibration modes which implement movements in interaction with air blades are governed by pneumatic damping processes when placed under air: for example flexing beams, translating masses. In the vicinity of ambient pressure, the dissipation is very sensitive to the pressure level. On the other hand at low pressure, with the molecule depletion, the dissipation coefficient does not change much. The quality factor of a MEMS can thus be controlled by the pressure level in a cavity in which the movable element is, which is obtained for example by hermetic sealing.

On the other hand, it does not enable two MEMS structures placed in identical cavities to be independently controlled. For example, a device which necessitates a low quality factor, for example an accelerometer, and another device which on the other hand needs a high quality factor, for example a gyrometer, can be desired to be co-integrated. By lowering the pressure in the cavity, both quality factors are influenced.

Further, the dissipation by pneumatic damping processes can be made negligible when the component is placed under a vacuum lower than 10 µbar. In any case, it cannot compensate for other dissipation processes such as those which result from thermoelastic processes in solids. It is not possible to bring the system to a self-oscillation regime through it.

Another solution consists in actively controlling the damping process in a MEMS. For that, an external viscous damping force is generated. Such a force is generated by means of a controllable actuator, via electronics, the control of which is proportional to the speed of the movable mechanical system. For example, that can be made using means for detecting the movement of the MEMS/NEMS, a PID (proportional, integral, derivative) corrector and an actuator, the whole forming a closed loop. This solution is for example described in document Yücetaş M, Aaltonen L, Pulkkinen M, Salomaa J, Kalanti A, Halonen K. *A charge balancing accelerometer interface with electrostatic damping. In: ESSCIRC (ESSCIRC), 2011 Proceedings of the.* 2011. p. 291-4. A system implementing capacitive type detection and actuation means is described. Although very efficient, this solution requires the implementation of an electronics external to the mechanical system as well as means for detecting the movement of the MEMS/NEMS. That results in a high bulk at the electronics and a high energy consumption, which limits the use of this configuration.

Document Lehee G, Souchon F, Riou J C, Bosseboeuf A, Jourdan G. "*Low power damping control of a resonant sensor using back action in silicon nanowires*". *In: 2016 IEEE 29th International Conference on Micro Electro Mechanical Systems (MEMS).* 2016. p. 99-102 describes a solution using the back action phenomenon or thermo-piezoresistive effect in a piezoresistive element, also designated by TPBA (Thermo piezoresistive Back action). It describes an oscillator comprising a movable mass able to rotatably oscillate in the plane and nanogauges formed by nanobeams between the mass and the substrate. Different positions for the nanobeams with respect to the pivot axis are tested. The nanogauges undergo a compression or tension upon moving the mass. The nanobeams are of boron-doped silicon. They are of a piezoresistive and thermoelastic material.

The nanobeams are electrically biased by a direct current, they undergo a self-heating $\Delta T = R_{th} P_j$ (I) which is proportional to the Joule power $P_j = RI^2$ with $R_{th}$ the thermal resistance of the beam and R the electrical resistance of the beam.

Because of the mass oscillation, the nanobeams with the length L undergo an elongation x with the length L.

This elongation causes a modification in the electrical resistance of the beam by piezoresistivity:

$$\delta R = \pi_g R \frac{x}{L}.$$

The Joule power is modified according to $\delta P = \delta R I^2$.

The temperature of the beams changes to a new value, that is a variation of $\delta T = R_{th} I^2 \delta R$ (II).

That leads to a back mechanical strain produced by thermoelasticity: $F = E \alpha \delta T$ with E the Young's modulus of the material making up the nanobeams, and $\alpha$ its heat expansion coefficient.

Finally, a force proportional to the motion of the MEMS structure is applied to the same:

$$F = E\alpha R_{th} I^2 \pi_g R \frac{x}{L}$$

A delay effect can be induced by the resistance and the thermal inertia of the nanobeams.

Indeed, a thermal constant time $\tau_{th} = R_{th} C_{th}$ appears because of the limits in the thermal energy flux between the system and the outside. This time constant can be seen as a delay to the establishment of a new temperature value. The temperature variation can be described as:

$$\delta T = R_{th} I^2 \delta R(t - \tau_{th}) \sim R_{th} I^2 (\delta R - \tau_{th} \delta \dot{R})$$

$$F = E\alpha R_{th} I^2 \pi_g R \left( \frac{x}{L} - \tau_{th} \frac{\dot{x}}{L} \right).$$

The back force produced by the measurement system therefore comprises a viscous term:

$$F_v = -\Gamma_{BA} \dot{x} \text{ with}$$

$$\Gamma_{BA} = \frac{\tau_{th} E\alpha R_{th} I^2 \pi_g R}{L}.$$

A more expansive modelling for the problem shows that the harmonic response of the force has actually the shape:

$$F(\omega) = E\alpha R_{th} I^2 \pi_g R \frac{x - j\tau_{th}\dot{x}}{1 + (\omega \tau_{th})^2}. \quad (III)$$

The dissipation force plays an important role in the vicinity of the resonance frequency $\omega_r$ of the MEMS/NEMS mechanical system. The effect will thus be maximum when the time constant will reach a value such that:

$\tau_{th} \omega_r \sim 1$.

Indeed, the following borderline cases show:

$\tau_{th} \omega_r \ll 1$, the system assumes a temperature which instantly depends on the MEMS/NEMS position on the oscillation period scale.

$\tau_{th} \omega_r \gg 1$, the power modulation due to the motion produces a low temperature modulation of the improved TPBA structure. On the oscillation period scale, the thermal energy amount exchanged between the TPBA beam and the electrical circuit is strongly reduced: the low temperature modulation generates a low-intensity thermoelastic force.

A thermo-piezoresistive feedback loop is obtained.

A thermo-piezoresistive feedback loop corresponds to the physical mechanism involved in the thermo-piezoresistive effect sequentially described. FIG. 2 of the abovementioned document Lehee G, Souchon F, Riou J C, Bosseboeuf A, Jourdan G. "*Low power damping control of a resonant sensor using back action in silicon nanowires*". In: 2016 *IEEE 29th International Conference on Micro Electra Mechanical Systems (MEMS)*. 2016. p. 99-102, provides an illustration for this loop. A mechanical load imposed to a mechanical element which is the object of a thermo-piezoresistive effect modifies the value of its electrical resistance by an amount AR. The joule power dissipated in this element, proportional to the resistance and to the electrical bias level imposed thereto, increases, which results in increasing the temperature produced by a joule self-heating. A thermoelastic force is finally produced by the mechanical element because of this temperature variation. That makes up a feedback loop, because the force obtained corresponds to a mechanical response obtained as a feedback from a mechanical load imposed at the beginning of the process.

The TPBA phenomenon offers a means for controlling the dissipation factor which is simple from the point of view of the control electronics. To operate, the system does not require a signal conditioning strength for the piezoresistive beam, nor a control electronics to shape an actuation signal: the feedback occurs locally and is self-induced.

On the other hand, such a mechanism turns out to be efficient to control the damping factor of a MEMS structure operating under vacuum with a low energy consumption at a few hundred of microwatt and on several orders of magnitude. In practice, the phenomenon intensity can be controlled by the bias level imposed to the piezoresistive beam, which offers a simple means for actively controlling the dissipation factor for a structure with a given architecture.

The thermo-piezoresistive feedback loop described herein does not enable the feedback sign to be readily controlled.

Indeed, the expression (III) shows that the feedback sign depends on the piezoresistive coefficient nig or the expansion coefficient α. These coefficients result from the intrinsic properties of the material and cannot be actively controlled or by choosing a particular structure.

Thus, it is accepted that a n-type doping is necessary to obtain a reduction in the dissipation coefficient of a resonator and in particular to make a self-oscillator at a frequency closer to the resonance frequency whose motion is maintained by the constant current. Indeed, for this doping type, silicon for example has a maximum piezoresistivity coefficient in direction [100] which is negative, unlike p-type silicon which has a maximum piezoresistivity coefficient which is positive in direction [110].

With a positive piezoresistivity coefficient (p-type doping), an overall increase in the resonator dissipation is achieved.

With a negative piezoresistivity coefficient, a negative feedback which amplifies the movement is achieved: the TPBA viscous coefficient compensates for the natural dissipation coefficient of the resonator. A self-oscillation regime is reached when this compensation is total.

This dependence on the piezoresistive coefficient sign is very restrictive because it imposes a doping type as a function of the TPBA effect desired. This doping choice can be on the other hand subjected to other constraints, for example constraints on detection criteria if the piezoresistivity is used as an electromechanical transduction means, constraints on temperature dependence criteria of the resistance or the transduction means.

Indeed, the thermo-piezoresistive effect can only be suppressed by making the bias current zero. But, the nanobeams are frequently used as piezoresistive deformation gauges, which requires a bias current to read the resistance variations.

Document Steeneken P G, Le Phan K, Goossens M J, Koops G E J, Brom G J a. M, van der Avoort C, and al. "*Piezoresistive heat engine and refrigerator*". Nat Phys. 2011 April; 7(4):354-9 describes a resonator implementing the TPBA effect the feedback of which is controlled by a continuous current generator. The feedback sign is controlled by modifying an impedance connected in parallel with the resistance of the thermo-piezoresistive beam. By reducing this impedance, the feedback sign is reversed.

The electronic circuit thus made forms a high pass filter the cutoff frequency of which is located about 300 kHz. Consequently, for resonators whose frequency is higher than this value, the feedback control is possible. On the other hand, for resonators operating at a lower frequency, for example a few kHz, capacitances in the order of 1 µF should be used. But these capacitance values are very difficult to integrate on integrated electronics such as ASIC (Application Specific for Integrated Circuit) in particular for bulk questions within a context in which the available space for electronics is often very restrictive. Consequently, such a system is not adapted for low frequency resonators, such as accelerometers or gyrometers.

Another means for controlling the TPBA feedback sign relies on the expansion coefficient: for some material (zirconium tungstate, copper iron germanate, water between 0 and 4° C. etc.), it can be negative, but it is for most of these materials, in particular silicon, positive. However, this solution is in practice difficult or even impossible to be implemented, because it demands to combine both expansion properties and suitable piezoresistive properties.

DISCLOSURE OF THE INVENTION

Consequently, a purpose of the present invention is to offer a microelectronic structure comprising at least one movable mass and having a thermo-piezoresistive effect, in which the force by the thermo-piezoresistive effect can be adapted, for example to compensate for or increase the intrinsic dissipation coefficient of the structure, without being constrained by the choice of the piezoresistive material and its doping of the state of the art, and at any operating frequency of the structure, for example lower than 100 kHz.

The abovementioned purpose is achieved by a microelectronic structure comprising at least one movable mass mechanically connected to at least one first mechanical element by first mechanical connection means and to a second mechanical element by second mechanical connection means which are electrically conductive and a DC voltage bias source for the second mechanical connection means. The second mechanical connection means are disposed with respect to the movable mass, such that movements of the movable mass apply mechanical deformation stresses to the second mechanical connection means, and these second mechanical connection means being such that they are the object of a thermo-piezoresistive effect.

The DC voltage bias means and the second mechanical connection means form a thermo-piezoresistive feedback electric circuit, generating a feedback force which can be adapted by virtue of the configuration of the electric circuit.

The inventors have determined that by biasing with a DC voltage the second mechanical connection means, a coefficient appear in the formula defining the thermo-piezoresistive feedback force, and that the value of this coefficient can be adjusted as a function of the electrical configuration of the electric circuit comprising the bias means and the second mechanical connection means, for example as a function of the value of an electrical resistance in series with the second mechanical connection means. That results in the damping coefficient being possibly modified, or even suppressed without having to choose the materials and/or the doping thereof to have a piezoresistive coefficient with a given sign. Indeed, this effect on the damping coefficient can be obtained whatever the frequency of the structure.

In the state of the art, a DC current bias is made. But, such a bias does not make a coefficient appear in the formula of the feedback force, which makes it possible to simply act on the feedback force.

Moreover, by virtue of the invention, it can be contemplated to suppress the thermo-piezoresistive effect while biasing the second mechanical connection means such that they act as a stress detection gauge.

Very advantageously, the circuit comprises current regulation means, for example comprising an electrical resistance with a determined value. Advantageously, the resistance value can be modified, for example a potentiometer is implemented, which makes it possible to be able to readily adjust the value of the feedback force. For example, the resistance can assume three values, a value amplifying the damping coefficient, a zero value, in this case the coefficient is equal to −1 and the feedback effect has an effect opposite to that obtained for example by current biasing the mechanical connection means having a positive piezoresistive coefficient, and a value nullifying the damping coefficient.

The feedback electric circuit can comprise a dipole having a negative electric resistance characteristic making it possible to be dispensed with possible stray resistances of the second mechanical connection means.

Therefore, one subject-matter of the present invention is a microelectronic structure comprising at least one movable mass mechanically connected to at least one first mechanical element by first mechanical connection means and to at least one second mechanical element by second electrically conductive mechanical connection means, electrical bias means for electrically biasing the second mechanical connection means, said second mechanical connection means being such that they are the object of a thermo-piezoresistive effect, the second connection means and the movable mass being disposed with respect to each other such that a movement of the movable mass applies a mechanical stress to the second connection means. The electric bias means are DC voltage bias means and form with at least the second mechanical connection means a thermo-piezoresistive feedback electric circuit.

The second mechanical connection means comprise at least one electrically conductive material. Advantageously, the second mechanical element can also be electrically conductive when it ensures an electrical continuity between the second mechanical connection means and the bias means.

In one exemplary embodiment, the thermo-piezoresistive feedback electric circuit comprises current regulation means electrically connected in series with the second mechanical connection means. The current regulation means can comprise at least one electric component able to assume a determined electric resistance value. Advantageously, the electrical component is such that it enables a determined electrical resistance value to be selected from several electrical resistance values, the electrical element being advantageously a potentiometer.

In one exemplary embodiment, the second mechanical connection means can have a given electrical resistance, and the electrical resistance of the regulation means can have a value lower than or equal to 5 times the electrical resistance value of the second mechanical connection means when the movable mass is an idle state.

In another exemplary embodiment, the second mechanical connection means have a given electrical resistance, and the electrical resistance of the regulation means can be equal to the electrical resistance of the second mechanical connection means so as to compensate for the thermo-piezoresistive effect.

The current regulation means are advantageously made on a substrate of the microelectronic structure so as to reduce stray capacitances.

In another exemplary embodiment, the current regulation means comprise at least one dipole connected in series with the second mechanical connection means, said dipole having a negative resistance characteristic. The dipole can be chosen from a tunnel diode, a Gunn diode, a thyristor and a feedback circuit comprising at least one operational amplifier.

In another exemplary embodiment, the current regulation means comprise at least one inductor connected in series with the second mechanical connection means.

According to an additional characteristic, the microelectronic structure can comprise active control means for actively controlling the bias voltage enabling a constant voltage to be applied to the second mechanical connection means.

The active control means for actively controlling the bias voltage can comprise a voltage feedback loop comprising means for measuring the voltage at the terminals of the second mechanical connection means, for example a 4-wire method, a comparator for comparing said measured voltage and a reference voltage, and a corrector sending a corrective signal to the bias means.

Advantageously, the second mechanical connection means comprise a beam.

The first mechanical element can be an anchoring pad secured to a support and the movable mass can be rotatably hinged with respect to the anchoring pad and the second mechanical element can be a second anchoring pad secured to the support.

BRIEF DESCRIPTION OF THE DRAWINGS

The present invention will be better understood based on the description that follows and the appended drawings in which.

DETAILED DISCLOSURE OF PARTICULAR EMBODIMENTS

In the present application, by "microelectronic structure", it is meant a resonating structure comprising microelectromechanical elements and/or nanoelectromechanical elements.

In the description that follows, the terms "viscous damping coefficient", "damping coefficient", "dissipation coefficient", "damping factor" and "dissipation factor" are considered as synonymous.

Figure 1:
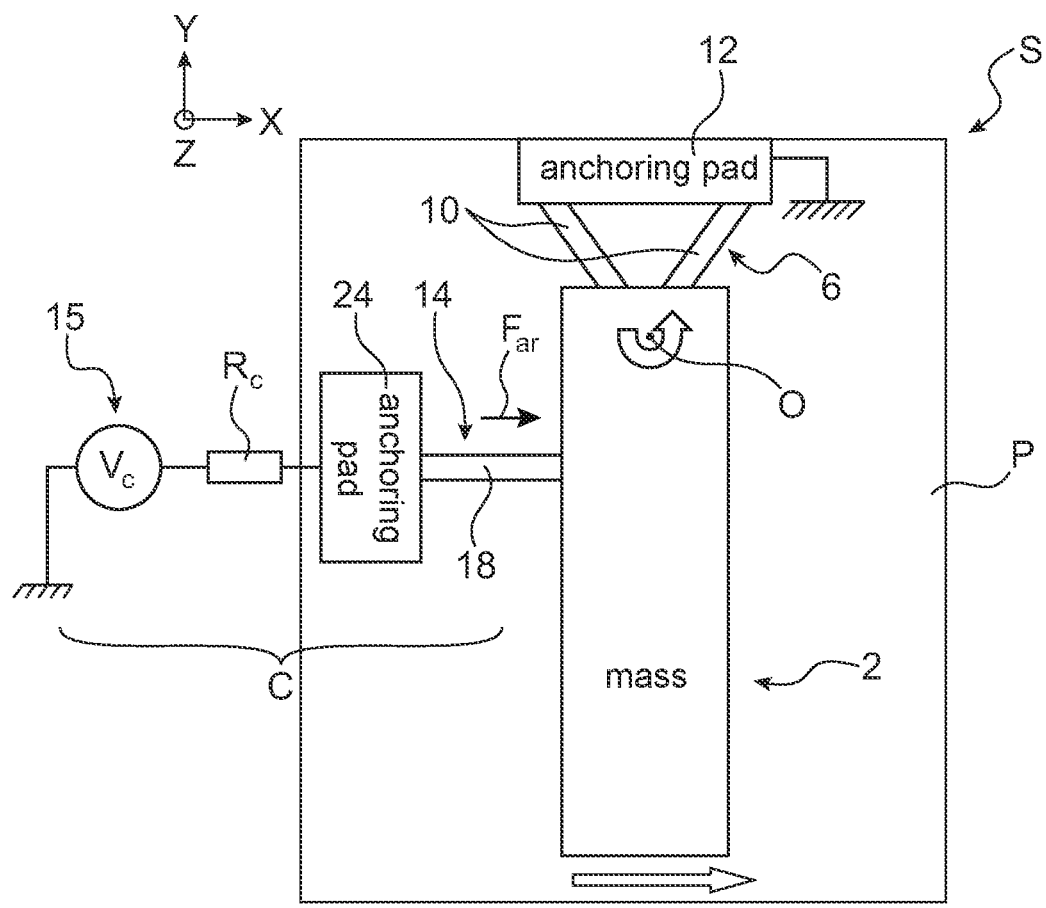
FIG. 1 is a schematic representation of an exemplary embodiment of a microelectronic structure according to the invention.

In FIG. 1, an example of a microelectronic structure S according to the invention can be seen. The structure extends along a neutral plane P defined by axes X and Y. The structure or resonator comprises a movable mass 2 able to be moved with respect to a support formed for example by a substrate. The movable mass 2 is connected to the support by the first connection means 6 such that they allow a movement of the movable mass 2 with respect to the support.

In the example represented, the first connection means 6 comprise a pivot hinge having a pivot axis Z orthogonal to the plane P. The movable mass 2 is thus able to be rotatably moved about the axis Z in the plane P. In the example represented, the pivot hinge comprises two beams 10 extending between an anchoring pad 12 and the movable mass 2, the beams 10 having axes intersecting at a point O which is the intersection of the axis Z with the plane P. The beams 10 are flexurally deformed and allow rotation of the mass about the axis Z. It will be understood that the pivot connection could be made differently.

The structure comprises second connection means 14 between the movable mass 2 and a second anchoring pad 24. The second connection means are electrically conductive.

As will be described in the following of the description, the second connection means 14 are such that they exert a force on the movable mass by thermo-piezoresistive back action. The second connection means 14 are thereby oriented with respect to the first connection means 6, such that they are mechanically biased by the moving movable mass 2, and such that the back action force Far is applied at least in the direction along which the mass can be moved. In this example, the movable mass 2 is mainly moved along direction X. The second connection means 14 are thereby such that they exert a back action force Far on the mass along the direction X.

The second connection means 14 are biased by the movable mass 2. Preferably, they are biased in tension and compression, while allowing flexure motions superimposing with the compression or tension.

The second connection means 14 comprise at least one thermo-piezoresistive effect zone. In the example represented, the second mechanical connection means comprise a beam 18 anchored to the movable mass and to the second anchoring pad.

The thermo-piezoresistive effect results from a coupling of electrical, thermal and mechanical phenomena within a mechanical structure, like a beam or a system comprised of beams, having all or part of the conductive, piezoresistive and thermoelastic properties. This effect is demonstrated by the appearance of a feedback force produced by the mechanical structure when it is mechanically biased, for example because of a deformation imposed by an external element, and when the mechanical structure is electrically biased. This force has components proportional to the deformation applied and to the rate of this deformation. The mechanism of this effect is described by a thermo-piezoresistive feedback loop.

The beam 18 is thereby made at least partly of a piezoresistive material and at least partly of a material having thermoelasticity properties. The beam 18 can comprise two distinct materials, the one piezoresistive and the other thermoelastic or a single material being both piezoresistive and thermoelastic. For example, silicon and SiGe are both piezoresistive and thermoelastic. In the case where the beam comprises several materials, these can be aluminium having an expansion coefficient of 23 ppm/K, whereas that of silicon is 2 ppm/K, associated with a piezoresistive material such as silicon. It can be contemplated that the beam comprises alternate portions of these materials disposed in the length direction of the beam.

In the present application, it is considered that an element has thermoelastic properties if it has an expansion coefficient at the working temperature higher than $10^{-7} K^{-1}$.

The second connection means 14 are such that they are able to exert mechanical strains onto the movable mass 2. For that, they have some stiffness and their connexion to the second anchoring pad is such that the force Far preferentially moves the movable mass.

The structure also comprises DC voltage bias means 15 for these second connection means. For example, the bias means 15 comprise a DC voltage generator applying a DC voltage Vc to the thermo-piezoresistive feedback circuit.

The bias means 15 form with the second mechanical connection means a feedback electric circuit.

In the example represented, the movable mass 2, the first mechanical connection means and the first anchoring pad are also electrically conductive and the first anchoring pad is connected to the ground. Thus, they form with the bias means and the second mechanical connection means a closed electric circuit. But it could be contemplated to only bias the second mechanical connection means, for example by connecting to the ground the end of the beam 18 connected to the movable mass 2 with an electrical connection advantageously having a negligible mechanical stiffness along the space directions with respect to the other mechanical connections. The electrical connection would thereby have a limited impact on the mechanical behaviour of the structure.

In the example represented, the thermo-piezoresistive feedback electric circuit C comprises an electrical resistance Rc connected in series with the beam 18 and disposed between a terminal of the bias means 15 and the second anchoring pad 24. The resistance can be directly made on the substrate of the microelectronic structure or be made outside the structure, for example on an application specific integrated circuit ASIC dissociated from the structure.

Figure 2:
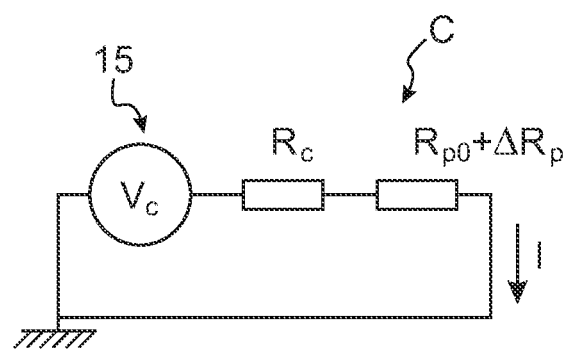
FIG. 2 is a representation of a circuit diagram of the feedback electric circuit of the structure of FIG. 1.

In FIG. 2, the circuit diagram of the feedback circuit C can be seen. The beam 18 is represented by its variable electrical resistance Rpo+δRp. Rpo is the electrical resistance value of the beam in the idle state (not subjected to a mechanical stress by the movable mass) which is a constant, and δRp is the electrical resistance variation of the beam because of a mechanical stress applied by the movable mass to the beam at least one part of which is of a piezoresistive material. I is the current in the circuit.

The operation of the feedback circuit is the following one.

The bias voltage $V_c$ biases the circuit. The current I thus assumes the following value:

$$I = I_0 + \delta I \approx \frac{V_c}{R_c + R_{p0}}\left(1 - \frac{\delta R_p}{R_c + R_{p0}}\right).$$

By considering δRp<<Rc+Rpo, for example δRp/Rpo<3%.

That is $$\delta I = -\frac{\delta R_p}{(R_c + R_{p0})^2}V_c.$$

The power delivered to the beam 18 can then be estimated with:

$$P = (R_{p0} + \delta R_p)(I_0 + \delta I)^2.$$

That is in the $\delta R_p$ first order $$P \approx R_{p0}\left(\frac{V_c}{R_c + R_{p0}}\right)^2\left(1 + \delta R_p \frac{R_c - R_{p0}}{R_{p0}(R_c + R_{p0})}\right).$$

The power delivered to the beam TPBA takes the form:

$$P = P_0 + \delta P$$

By setting $I_0 = \frac{V_c}{R_c + R_{p0}}$.

$$P_0 = R_{p0}\left(\frac{V_c}{R_c + R_{p0}}\right)^2 = R_{p0}I_0^2$$

and $$\delta P = \eta \frac{\delta R_p}{R_{p0}}$$

with $\eta = \frac{R_c - R_{p0}}{R_c + R_{p0}}$.

the force generated by the thermo-piezoresistive effect or the feedback force is written as $$F(\omega) = \eta E \alpha R_{th} I_0^2 \pi_g R_{p0} \frac{x - j\tau_{th}\dot{x}}{1 + (\omega\tau_{th})^2}.$$

Thus, by choosing the Rc value, the coefficient η and thus the feedback force can be modified. For example, it is possible to vary the coefficient η from −1 to +1 when Rc>0.

The resistance thus enables the current to be regulated in the piezoresistive feedback electric circuit C and thus the back action effect to be set.

By acting on the value of the resistance $R_c$ with respect to the resistance $R_{p0}$, it is possible to vary the parameter η from −1 to +1.

It is thus possible to control the sign and presence of the thermo-piezoresistive action effect, by adjusting the $R_c$ value with respect to $R_p$ on a wide operating frequency range of the microelectronic structure.

In the circuit diagram, the resistance Rc has a fixed value.

Preferably, Rc is equal to at most 5 times the Rp0 value, in order to limit energy consumption.

The resistance Rc is a resistance whose value is determined, either it is a fixed value that cannot be modified, or it is a modifiable value as will be described in the following. The resistance Rc is a resistance deliberately added in the thermo-piezoresistive feedback electric circuit and whose effect on the back action force is determined, the resistance Rc is distinct from the stray resistances which exist for example at the access tracks, but whose value is not determined.

Rc values having a particular interest are given below.

For Rc=Rpo, the coefficient q has the value $\eta=0$. In this case, the effect is compensated for. The resonator gets back to its natural dissipation coefficient, there is no longer a thermo-piezoresistive back action effect.

For Rc>>Rpo, the coefficient n has the value $\eta=1$. In this case, the feedback has the same sign as the usually obtained effect when the bias is a current bias.

Figure 3:
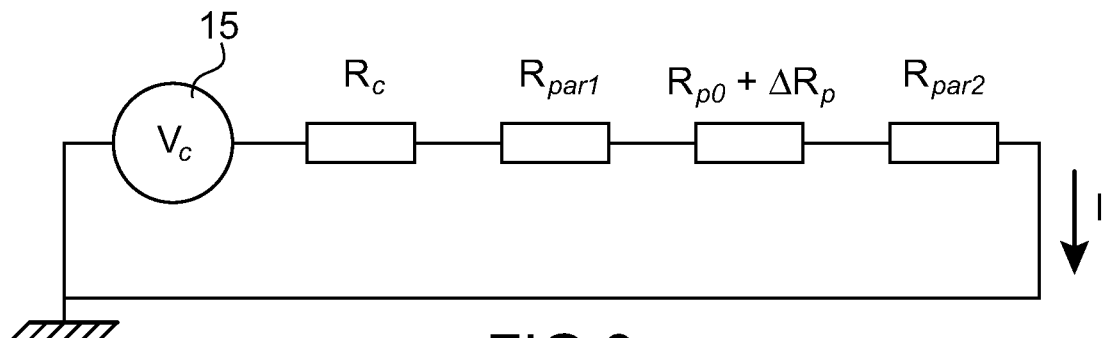
FIG. 3 is a representation of a circuit diagram of a feedback electric circuit comprising stray resistances.

For Rc=0 or Rc<<Rp0, the coefficient $\eta$ has the value $\eta=-1$. In this case, the feedback has a sign opposite to the usually obtained effect when the bias is a current bias. In this particular case, the structure is made such that the stray electrical resistances in series with the beam are reduced. In FIG. 3, these stray resistances are designated by Rpar1 and Rpar2. These stray resistances can result from the access tracks to the beam 18, indeed, their resistivity is not always negligible. They can reach a few tens of percents of the resistance value of the beam, or even exceed this value. The resistances could be structurally reduced for example by using strong-conductivity materials up to the beam anchoring, by dimensioning the access tracks . . . .

By virtue of the invention, the action on the feedback force can occur on a wide operating frequency range, from null frequencies up to high frequencies.

The upper limit of the frequency is set by stray capacitances Cpar. A high frequency $$\omega_c = \frac{1}{R_c C_{par}}$$

can limit the operating range of the system.

Advantageously, the resistance $R_c$ is integrated to the substrate of the microelectronic structure in the proximity of the second connection means 18 in order to reduce the stray capacitance to a value lower than 100 fF. The upper limit of the frequencies can thus be brought up to a value in the order of about one hundred Megahertz.

Figure 4:
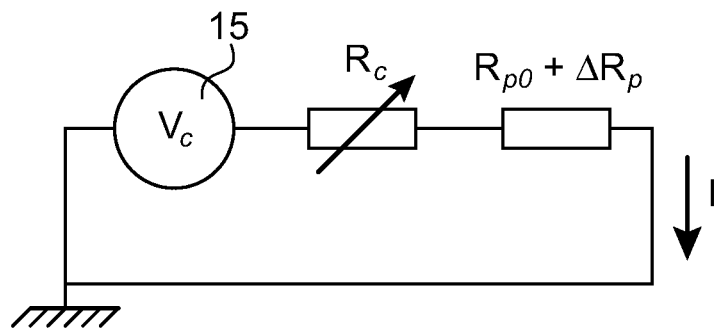
FIG. 4 is a representation of a circuit diagram of another exemplary feedback electric circuit that can be implemented in the structure according to the invention.

In FIG. 4, another exemplary embodiment of a very advantageous feedback circuit can be seen, wherein the resistance Rc comprises a potentiometer enabling the feedback sign to be controlled in situ and very precisely. It is also possible in this way to activate or deactivate the back action effect in the microelectronic structure. When the resistance Rc is increased by handling the potentiometer, the average current delivered tends to decrease, which results in reducing the back action effect. Advantageously, the bias voltage is adjusted such that the average current delivered is constant. For example, the value of the bias voltage can be linked to the Rc value. However, an independent control can be maintained on the voltage source.

Alternatively, the resistance could be replaced by a device capable of assuming several resistance discrete values, for example three values, for example null, equal to Rpo and a value much higher than Rpo.

The potentiometer can be integrated on the chip of the microelectronic structure or in an ASIC from a Junction Field Effect Transistor (JFET) technology for example used for the following components: Vishay AN105®, Fairchild®, Philips semiconductor BF245C®.

Figure 5:
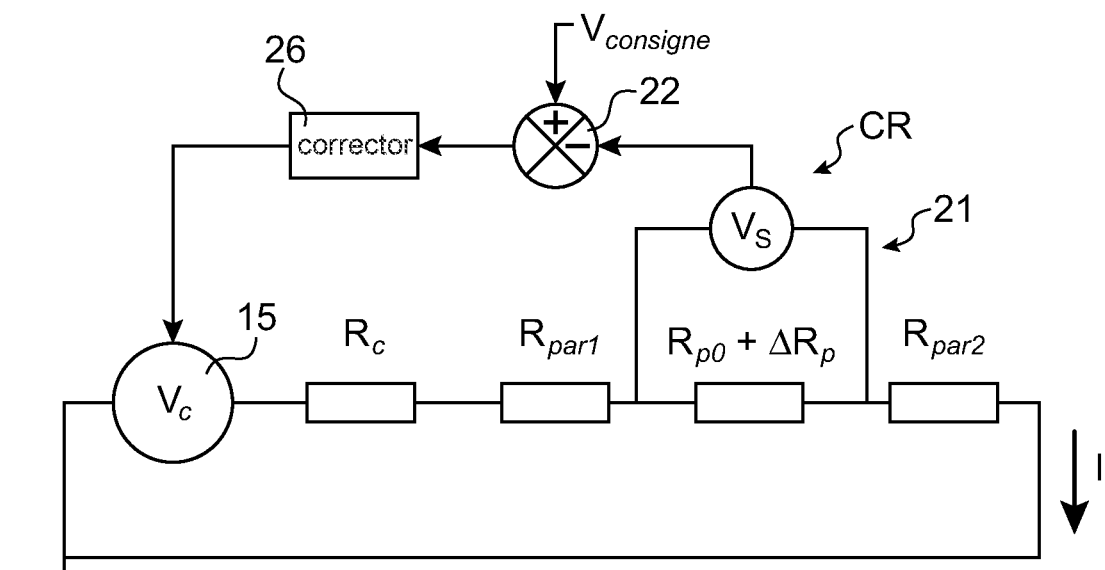
FIG. 5 is a representation of a circuit diagram of another feedback electric circuit that can be implemented in the structure according to the invention, comprising an active control for the bias voltage.

In FIG. 5, another exemplary feedback circuit comprising means for actively controlling the bias voltage can be seen.

As has already been explained above, the circuit can comprise stray resistances the effect of which is preferably reduced. For that, the circuit comprises means for actively controlling the bias voltage implementing a voltage feedback loop BR.

The minimum resistance in series with the resistance Rp of the beam 18 is reduced to $R_{par1}+R_{par2}$. These stray resistances limit the value of the coefficient $\eta$ to:

$$\eta(R_c) = \frac{R_c + R_{par1} + R_{par2} - R_{p0}}{R_c + R_{par1} + R_{par2} + R_{p0}} \geq \frac{R_{par1} + R_{par2} - R_{p0}}{R_{par1} + R_{par2} + R_{p0}} > -1.$$

The means for actively controlling the bias voltage comprise means 21 for probing the voltage Vs at the terminals of the beam 18, for example by the 4-wire method, well known to those skilled in the art, which enables the stray resistances effect to be dispensed with.

For that, access tracks dissociated from the bias circuit are made up to the ends of the beam 18. The use of a voltage probe having a high impedance with respect to the impedance of these tracks and that of the beam 18 joined together enables the voltage across the beam 18 to be precisely measured.

The control means also comprise a comparator 22 for comparing this voltage measured across the beam to a reference value $V_{consigne}$, and a corrector 26 which drives the voltage generator $V_c$ based on the signal emitted by the comparator in order to remove the error signal $\in = V_{consigne} - V_s$.

Thanks to these active control means, the voltage across the beam 18 is maintained constant and equal to $V_{consigne}$. The back action effect obtained is substantially that obtained for $\eta=-1$ because the stray resistances and Rc have no longer influence.

Figure 10:
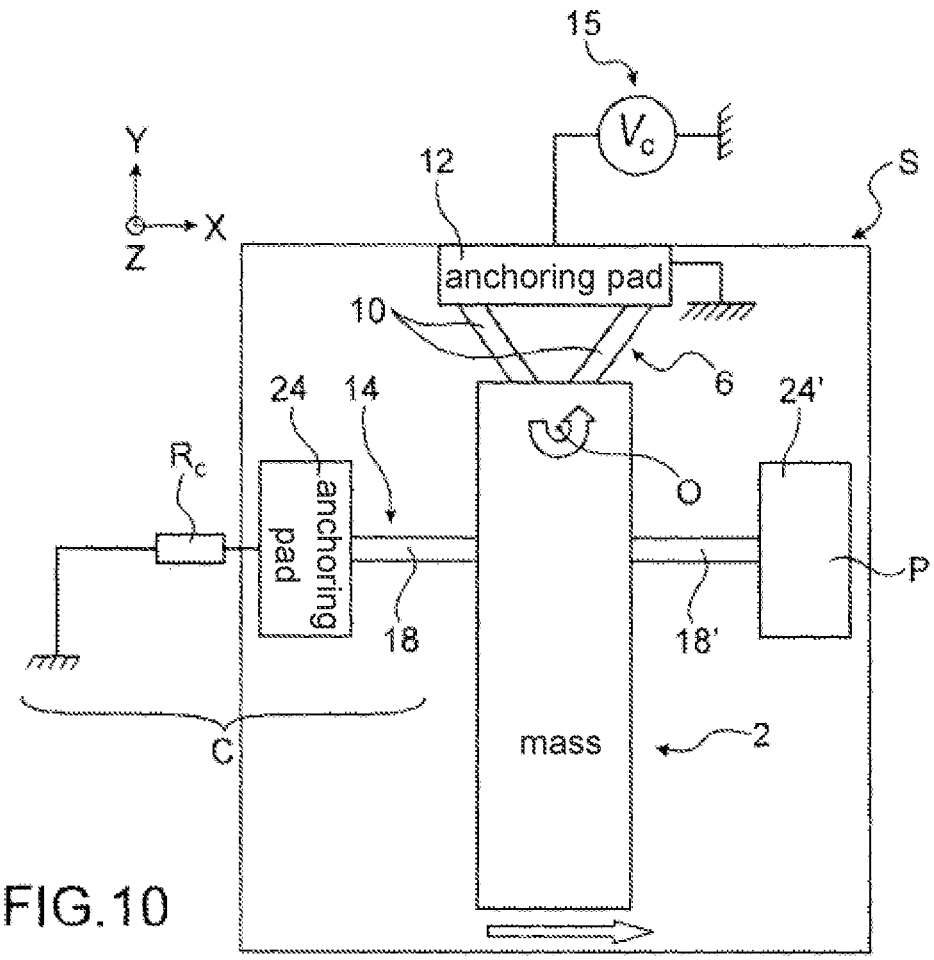
FIG. 10 is a schematic representation of another exemplary embodiment of a microelectronic structure according to the invention comprising two second mechanical connection means.

In FIG. 10, another exemplary embodiment of a microelectronic structure according to the invention can be seen, which differs from the structure of FIG. 1, in that it comprises a second beam 18' suspended between the mass 2 and a pad 24'. The beam 18' and the pad 24' are symmetrical with the pad 24 and the beam 18 with respect to a plane passing through the axis of rotation of the mass. This structure can be used in an inertial device, for example an accelerometer, the beams forming differential connected gauges.

Figure 11:
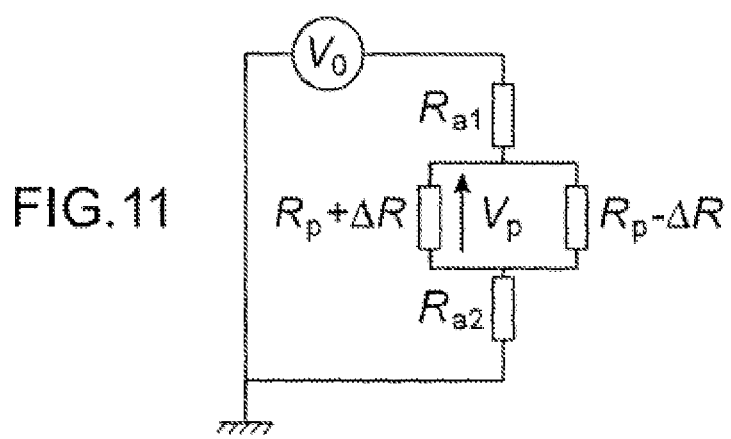
FIG. 11 is an exemplary circuit diagram applicable to the structure of FIG. 10.

In FIG. 11, the circuit diagram of the structure of FIG. 10 can be seen. Both beams are connected in parallel to the bias source 15 and both beams are electrically connected. This connection advantageously enables the bias voltage to be maintained constant across the beams by putting the access resistances in common.

$R_{p1}$ is the resistance of the beam 18 without mechanical load and $\Delta R_1$ is the variation in the resistance $Rp_1$ when it is subjected to a stress.

$R_{p2}$ is the resistance of the beam 18' without a mechanical load and $\Delta R_2$ is the variation in the resistance $Rp_2$ when it is subjected to a stress.

The resistances $Rp_1$ and $Rp_2$ have opposite resistance variations, indeed when one of beams is compressed, the other is stretched.

$R_{a1}$ and $R_{a2}$ are the access resistances. In this configuration, the access resistances $R_{a1}$ and $R_{a2}$ are put in common for both piezoresistive elements 18 and 18'. The equivalent resistance of the dipole formed by both parallel elements 18 and 18' does not depend on the first order of the resistance variation $\Delta R$ which occurs in an opposite way in each of both these elements.

Indeed, by considering $R_{p1}=R_{p2}$ $$R_{eq} = \frac{R_{p1}}{2} - \frac{\Delta R_1^2}{2R_{p1}}.$$

Under these conditions, the voltage across both piezoresistive elements remains constant in the $\Delta R_1$ first order.

$$V_p = \frac{R_{p1}V_0}{R_{p1}+R_{a1}+R_{a2}}.$$

Advantageously:
resistances $R_{par1}$ and $R_{par2}$ substantially identical within 20%,
opposite variations of the resistances $\Delta R_1$ and $\Delta R_2$ with modules identical within 20%, are chosen.

Thereby $$V_p = \frac{R_{eq0}V_0}{R_{a1}+R_{a2}+R_{eq0}}\left(1-\epsilon\frac{R_{p1}-R_{p2}}{R_{p1}+R_{p2}}\left(1-\frac{R_{eq0}}{R_{a1}+R_{a2}+R_{eq0}}\right)\right) \text{ with}$$

□

$$R_{eq0} = \frac{R_{p1}R_{p2}}{R_{p1}+R_{p2}} \text{ and } \epsilon = \frac{\Delta R_1}{R_{p1}} = -\frac{\Delta R_2}{R_{p2}}$$

which are supposed opposite in the present case.

The factor $$\frac{R_{p1}-R_{p2}}{R_{p1}+R_{p2}}$$

characterises the unbalanced searched for.

Alternatively, only one of both access resistances can be put in common.

Figure 6:
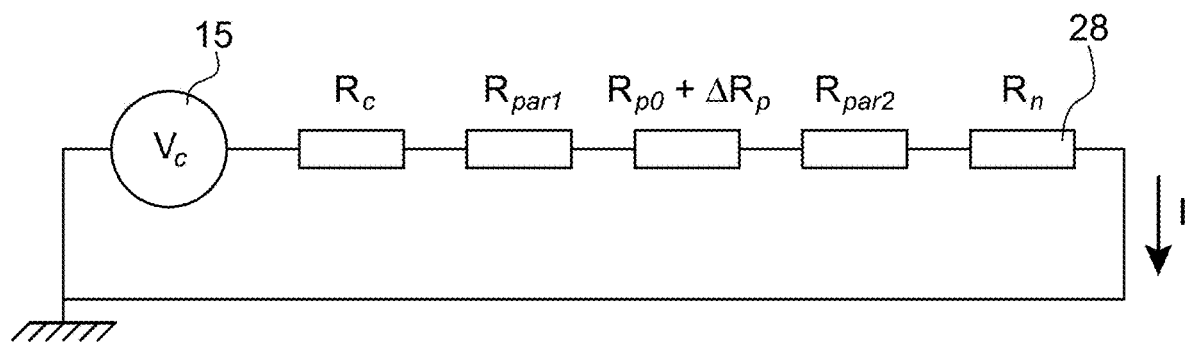
FIG. 6 is a representation of another exemplary feedback electric circuit that can be implemented in the structure according to the invention, implementing a dipole having a negative electric resistance characteristic.

In FIG. 6, another exemplary feedback circuit according to the invention implementing a dipole 28 having a negative resistance characteristic Rn can be seen. The dipole 28 is electrically connected in series with the beam 18.

The use of such a dipole advantageously enables the presence of stray resistances to be dispensed with in the feedback circuit.

Figure 7:
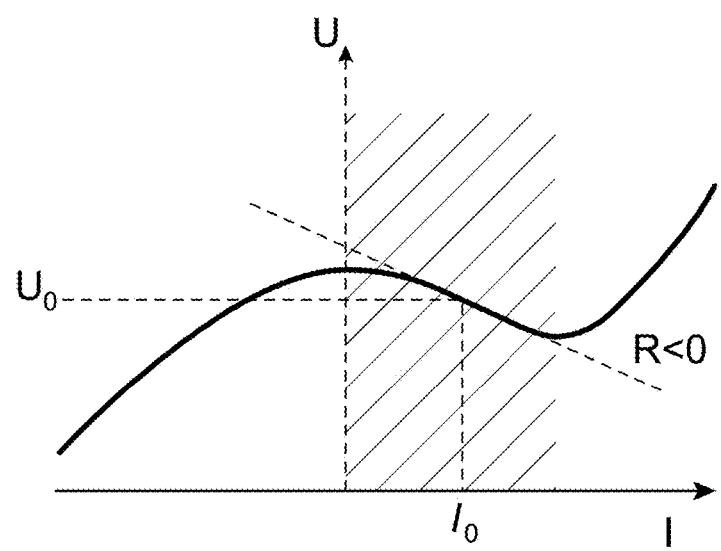
FIG. 7 represents the characteristic of a dipole (voltage U as a function of the current I) having a negative resistance behaviour in the vicinity of an operating point $I_0$, $U_0$.

The dipole 28 has a negative resistance characteristic, at least in the vicinity of an operating point $U_0$, $I_0$ (FIG. 7). This behaviour type can be achieved with dipoles of the tunnel diode, Gunn diode, thyristor type, by a feedback circuit based on an operational amplifier or any component known to those skilled in the art having a negative resistance characteristic.

For a rated current $I_0$ desired in the beam 18 at the idle state, the generator voltage to be applied can be estimated with $V_c = U_0 + (R_c + R_{par1} + R_{par2} + R_{p0})I_0$. In the vicinity of this point, the dipole has the following behaviour:

$$U = U_0 + R_n(I - I_0).$$

Thus, in the presence of a variation in the resistance $\delta R_p$ for the beam, the new balance is obtained for $I = I_0 + \delta I$ $$V_c = U_0 + (R_c + R_{par1} + R_{par2} + R_{p0} + R_n + \delta R_p)(I_0 + \delta I) - R_n I_0.$$

That is $$0 \approx \delta R_p I_o + (R_c + R_{par1} + R_{par2} + R_{p0} + R_n)\delta I$$

$$\frac{\delta I}{I_o} \approx \frac{\delta R_p}{(R_c + R_{par1} + R_{par2} + R_{p0} + R_n)}.$$

The power modulation across the beam 18 has the following expression:

$$P_o + \delta P = (R_{p0} + \delta R_p)(I_o + \delta I)^2$$

$$\frac{\delta P}{P_o} = \frac{\delta R_p}{R_{p0}} - 2\frac{\delta R_p}{(R_c + R_{par1} + R_{par2} + R_{p0} + R_n)}.$$

Finally:

$$\frac{\delta P}{P_o} = \eta_n \frac{\delta R_p}{R_{p0}}$$

With:

$$\eta_n = \frac{R_c + R_{par1} + R_{par2} + R_n - R_{p0}}{R_c + R_{par1} + R_{par2} + R_n + R_{p0}}.$$

The force exerted on the system then takes the form:

$$F(\omega) = \eta_n E \alpha R_{th} I_0^2 \pi_g R_{p0} \frac{x - j\tau_{th}\dot{x}}{1+(\omega\tau_{th})^2}.$$

The factor $\eta_n$ can actually reach −1 when $R_c=0$ and $R_n$ compensates for $R_{par1}+R_{par2}$. This exemplary embodiment enables the problem of the presence of stray resistances to be overcome. Further, this system enables the reverse back action effect to be enhanced. Indeed, for a negative resistance $R_n$ with an absolute value which approaches the sum of the resistances making up the circuit ($R_c+R_{par1}+R_{par2}\pm R_{p0}$), the coefficient $\eta_n$ diverge to infinity by a negative value: that occurs for $R_c+R_{par1}+R_{par2}+R_n+R_{p0} \sim 0$. The self-oscillation appears as soon as the damping is compensated for. In the presence of a negative damping coefficient, in addition to the self-oscillation, the mechanical response time decreases with an increasing $\eta_n$ intensity and the system reaches quicker its self-oscillation regime after a given disturbance.

Preferably, $R_c$ is chosen close to 0 in order to reduce the Joule effect dissipation.

By virtue of the invention, it is possible to compensate for the air dissipation. Indeed, the invention enables the dissipation coefficient to be amplified by a factor higher than 1 in absolute value, the values of the air dissipation coefficient and the back effect dissipation coefficient thereby approach each other.

According to one alternative, the resistance $R_c$ can be replaced or completed by an inductor with the value L. The inductor indeed produces a low impedance at a low frequency and an impedance which diverges at a high frequency (cutoff frequency $$\frac{R_p}{L}).$$

That enables the current to be stabilised above the cutoff frequency. By associating an inductor to the resistance Rc, the dissipation effect can be differently driven on two vibration modes located below and above the cutoff frequency. Below the cut off frequency, the thermo-piezoresistive effect is driven by the resistance $R_c$ and above the cutoff frequency, the thermo-piezoresistive effect is driven by the inductor.

As has been indicated above, the back action effect can be theoretically compensated for when Rc=Rp0. But in practice, this compensation can occur for an Rc value different from $R_{p0}$, in particular if a modulation effect of the thermal conductivity at the mechanical stress is also present. Indeed, the temperature modulation in the TPBA beam depends not only on:

the power modulation $$\delta P = \eta 1_0^2 \pi_g R \frac{x}{L}$$

but also the resulting thermal resistance modulation $$\delta R_{th} = \frac{\pi_\sigma R_{th0} x}{L}$$

or $\pi_\sigma$ is a coefficient which characterises the sensitivity of the thermal conductivity to the mechanical deformation $$\frac{x}{L}.$$

L being the length of the beam 18.
The thermoelastic force can be written as:

$$F(\omega) = E\alpha R_{th0} R_{p0} I_0^2 \frac{\eta \pi_g + \pi_\sigma}{L} \frac{x - \tau_{th}\dot{x}}{1 + (\omega \tau_{th})^2}.$$

The sign and intensity of the feedback are in particular controlled by the factor:

$$\eta + \frac{\pi_\sigma}{\pi_g}$$

The η value can be adjusted so as to compensate for the term $$\frac{\pi_\sigma}{\pi_g}.$$

In practice, the sensitivity of the thermal conduction coefficient $\pi_\sigma$ is low with respect to the piezoresistivity coefficient $\pi_g$ which is involved in the dissipated power modulation: the $R_c$ value which enables the thermo-piezoresistive effect to be deactivated will be close to $R_p$ within a few tens of percents.

In the example of FIG. 1, the mass is rotatably movable in the plane of the structure. Any structure the mass of which is translationally and/or rotationally movable in-plane and/or off-plane is within the scope of the present invention.

The present invention can be applicable to any structure comprising a thermo-piezoresistive effect beam. For example, it can be applied to a structure comprising two mechanically connected movable masses, a resistance Rc could be placed in series with the second mechanical connection means between both masses, two connection means connecting the resistance Rc to the other mass, these other connection means having for example no thermo-piezoresistive effect, and/or having a negligible stiffness. It can be contemplated to dispose As regards the second mechanical connection means, they are preferentially formed by a rectilinear beam, but it can be contemplated that they comprise several beam portions the axes of which form an angle with each other. The angle is chosen low such that the back action in the second connection means is preferentially used to apply a strain on the anchorings and not to deform the beam in itself. Further alternatively, it can be contemplated that the second mechanical connection means are in the shape of an arc of circle.

The second mechanical connection means are chosen such that their mechanical stiffness in the motion direction of the mass is comparable to or higher than the stiffness of the movable masse coupled with the first mechanical connection elements along the same, direction.

Figure 9A:
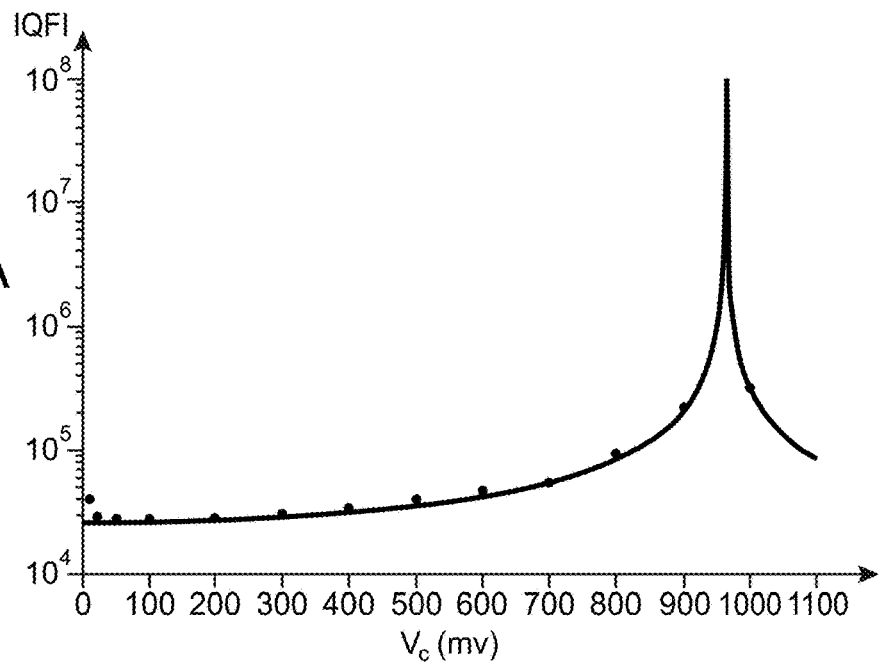
FIG. 9A is a representation of the absolute variation of the quality factor QF of a structure close to that of FIG. 1 as a function of the DC bias voltage Vc in mV.
Figure 9B:
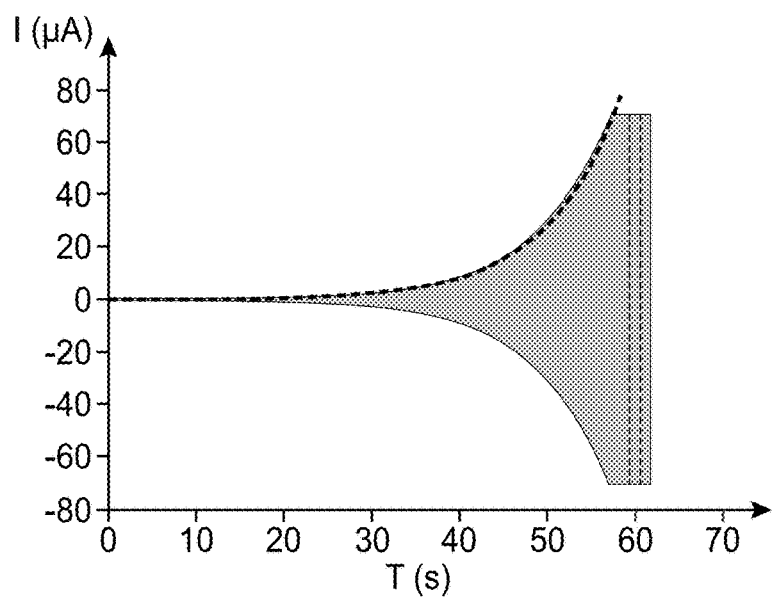
FIG. 9B is a representation of the variation in the delivered current I in µA as a function of time t in s.
Figure 9C:
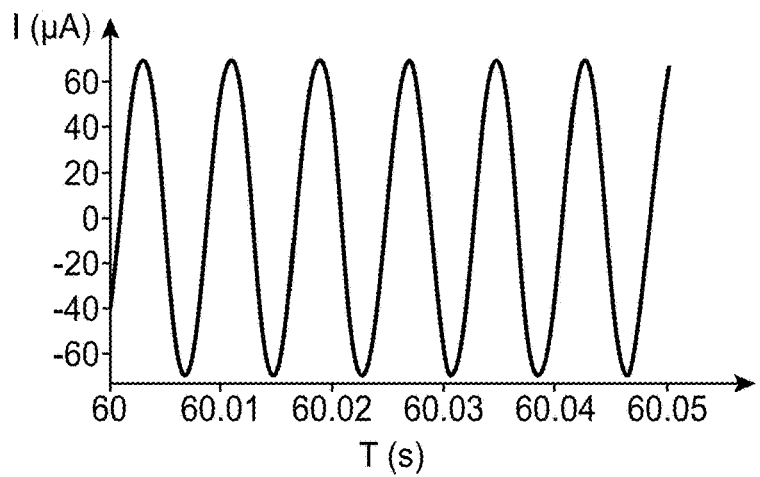
FIG. 9C is an enlarged view of FIG. 9B beyond 60 s.

FIGS. 9A to 9C represent experimental results obtained on a structure close to the structure of FIG. 1. A voltage bias of a thermo-piezoresistive effect beam, of 5e19 cm$^{-3}$ p-doped silicon, is made in the presence of a resistance Rc much lower than the resistance Rp.

A reduction effect of the friction coefficient is observed, which is reflected in FIG. 9A by an increase in the quality factor QF. By virtue of the invention, a reduction in the dissipation for beams of p-doped silicon is obtained, whereas in the state of the art, this reduction was only contemplatable for n-doped beams at least at a low frequency (<100 kHz). It is noticed that for a bias voltage from 900 mV, the thermo-piezoresistive effect fully compensates for the intrinsic losses of the resonator.

FIG. 9B shows the time sequence of the MEMS structure a 1V bias of which is made at about t=20 s. An exponential growth of the amplitude of the current delivered is observed. The amplitude is stabilised then because of the system non-linearities which re-balance the energy exchanges of the resonator with the outside. FIG. 9C shows an enlarged view of the stabilisation zone.

An example of a method for making the structure according to the invention will now be described, of which different steps can be schematically seen in FIGS. 8A to 8F.

A SOI (Silicon on insulator) structure is for example used, comprising a substrate 402, a buried oxide (BOX) layer 404, and a silicon layer 406. The silicon layer 406 has for example a thickness in the order of 200 nm. Generally, the layer 406 can be polycrystalline or single crystal Si, SiGe or Ge.

A structuring of the silicon layer 406 is then made, for example by photolithography and etching with a barrier on the oxide layer 406, which enables the connection means to be defined.

Figure 8A:
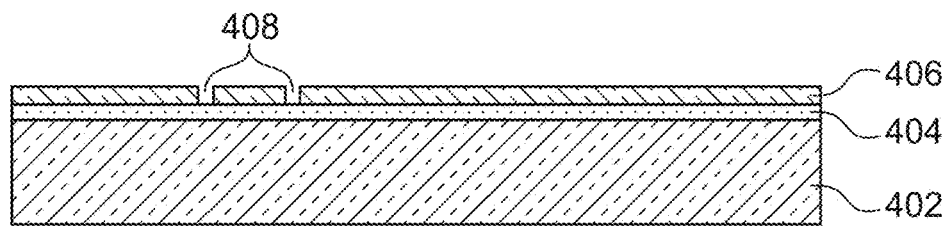
FIGS. 8A to 8F are schematic representations of the different steps of an exemplary method for making a microelectronic structure according to the present invention.

The element thus obtained is represented in FIG. 8A.

During a following step, a deposition of an oxide layer 410 is made on the silicon layer 406 to fill the previously etched zones 408, then an etching of the oxide layer 410 is made to only leave an oxide portion deposited on the silicon layer 406 and connecting the oxide filling the trenches. The etching can be made by dry etching with a barrier on Si or by wet etching, for example using a sulphuric acid based solution.

Figure 8B:
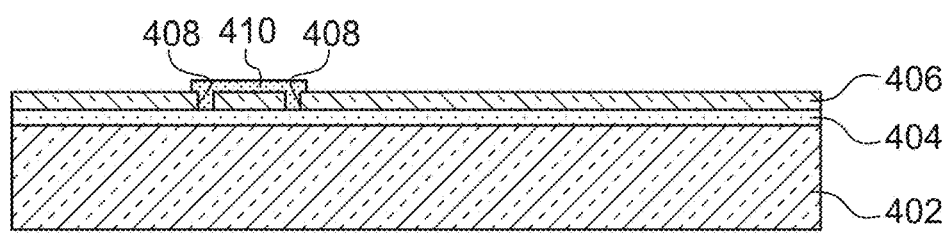

The element thus obtained is represented in FIG. 8B.

During a following step, a deposition of a silicon layer 412 is formed. The layer 412 is for example obtained, by epitaxial growth, and has a typical thickness from 1 to 50 µm, for example 10 µm. More generally, the layer 412 can consist of polycrystalline or single crystal Si, SiGe, Ge, or a metal material; the deposition can be made by epitaxy or by physical/chemical vapor deposition (PVP/CVD) type methods.

Figure 8C:
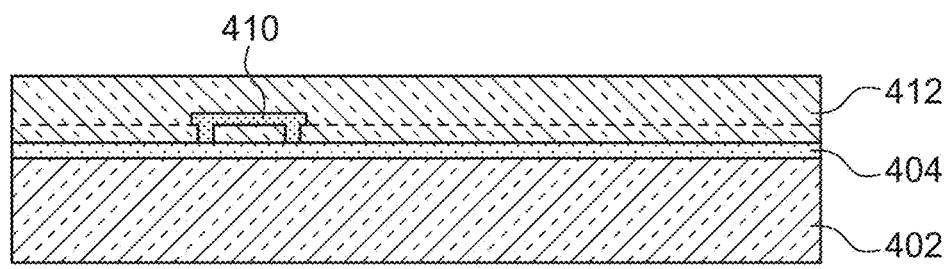

The element thus obtained is represented in FIG. 8C.

During a following step, electrical contacts 414 are made. For that, a deposition of a metal layer (AlSi or Au for example) is made, the zones to be removed and preserved are distinguished by photolithography. Then, the metal layer is etched by dry etching with a barrier on Si or by wet etching selective to Si to only preserve the contacts 414.

Figure 8D:
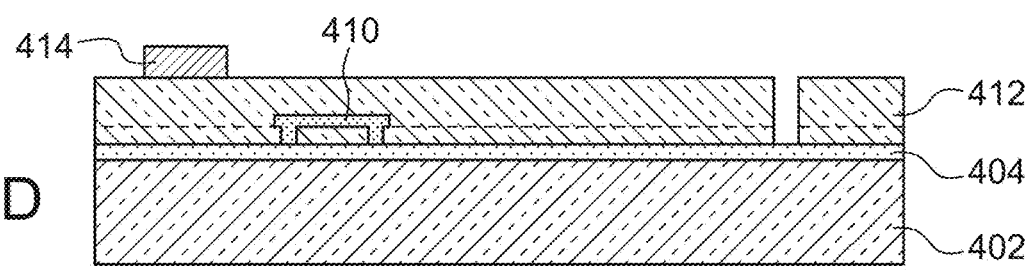

The element thus obtained is represented in FIG. 8D.

During a following step, the silicon layers 406 and 412 are structured to define the movable mass and the first connection means and the second connection means, for example by photolithography and deep etching with a barrier on the oxide layers 404 and 410.

Figure 8E:
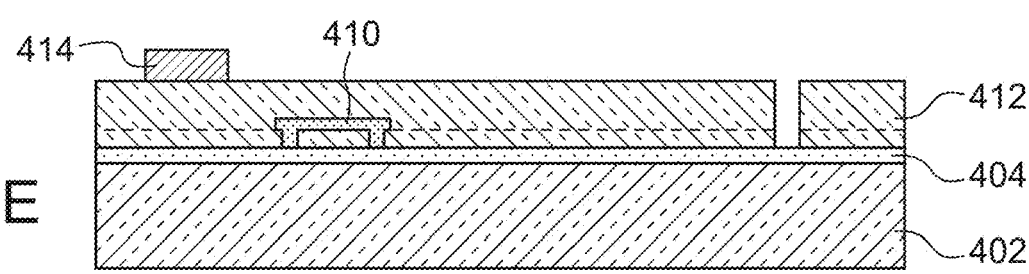

The element thus obtained is represented in FIG. 8E.

During a following step, the movable mass and the first and second connection means are released, for example by wet etching of the oxide 404, for example by means of a liquid and/or vapor hydrofluoric acid (HF). That is an etching over time. The hydrofluoric acid is left in contact with the oxide layer for the time necessary to release the movable mass, the first and second connection means while leaving the oxide layer between the substrate and the fixed parts.

Figure 8F:
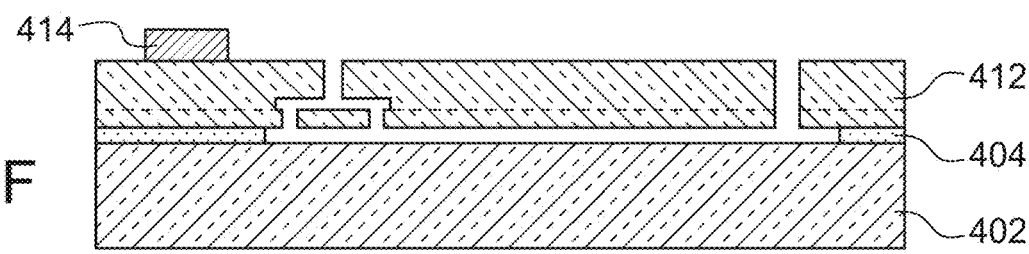

The element thus obtained is represented in FIG. 8F.

The MEMS/NEMS micro and nanostructures according to the invention that offer means for controlling the viscous damping can for example be implemented in MEMS/NEMS micro-sensors and micro-actuators.

The invention claimed is:

1. A resonating microelectronic structure comprising at least one movable mass mechanically connected to at least one first mechanical element by at least a first mechanical connector and to at least one second mechanical element by at least a second electrically conductive mechanical connector, said movable mass being configured to be vibrated by an external stimulus, an electrical bias device for electrically biasing the second mechanical connector, said second mechanical connector being the object of a thermo-piezoresistive effect, the second mechanical connector and the movable mass being disposed with respect to each other such that a movement of the movable mass applies a mechanical stress to the second mechanical connector, wherein the electrical bias device is a DC voltage bias device and forms with at least the second mechanical connector a thermo-piezoresistive feedback electric circuit wherein the first mechanical element is an anchoring pad secured to a support and the movable mass is rotatably hinged with respect to the anchoring pad and wherein the second mechanical element is a second anchoring pad secured to the support.

2. The resonating microelectronic structure according to claim 1, wherein the thermo-piezoresistive feedback electric circuit comprises a current regulator electrically connected in series with the second mechanical connector.

3. The resonating microelectronic structure according to claim 2, wherein the current regulator comprises at least one electrical component configured to assume a determined electrical resistance value.

4. The resonating microelectronic structure according to claim 3, wherein the electrical component is configured to select a determined electrical resistance value from several electrical resistance values.

5. The resonating microelectronic structure according to claim 4, wherein the electrical component is a potentiometer.

6. The resonating microelectronic structure according to claim 3, wherein the second mechanical connector has a given electrical resistance and wherein the electrical resistance of the current regulator has a value lower than or equal to 5 times the electrical resistance value of the second mechanical connector when the movable mass is in the idle state.

7. The resonating microelectronic structure according to claim 3, wherein the second mechanical connector has a given electrical resistance and wherein the electrical resistance of the current regulator is equal to the electrical resistance of the second mechanical connector so as to compensate for the thermo-piezoresistive effect.

8. The resonating microelectronic structure according to claim 2, wherein the current regulator comprises at least one dipole connected in series with the second mechanical connector, said dipole having a negative resistance characteristic in the vicinity of the operating point of the resonating microelectronic structure.

9. The resonating microelectronic structure according to claim 8, wherein the dipole is chosen from a tunnel diode, a Gunn diode, a thyristor and a feedback circuit comprising at least one operational amplifier.

10. The resonating microelectronic structure according to claim 2, wherein the current regulator comprises at least one inductor connected in series with the second mechanical connector.

11. The resonating microelectronic structure according to claim 2, comprising an active controller for actively controlling the bias voltage enabling a constant voltage to be applied to the second mechanical connector.

12. The resonating microelectronic structure according to claim 11, wherein the active controller for actively controlling the bias voltage comprise a voltage feedback loop comprising measurement device for measuring the voltage at the terminals of the second mechanical connector, a comparator for comparing said measured voltage and a reference voltage, and a corrector sending a corrective signal to the electrical bias device.

13. The resonating microelectronic structure according to claim 12, wherein the measurement device is configured to measure the voltage at the terminals of the second mechanical connector by a 4-wire method.

14. The resonating microelectronic structure according to claim 1, wherein the second mechanical connector comprises a beam.

15. A resonating microelectronic structure comprising at least one movable mass mechanically connected to at least one first mechanical element by at least a first mechanical connector and to at least one second mechanical element by at least a second electrically conductive mechanical connector, said movable mass being configured to be vibrated by an external stimulus, an electrical bias device for electrically biasing the second mechanical connector, said second mechanical connector being the object of a thermo-piezoresistive effect, the second mechanical connector and the movable mass being disposed with respect to each other such that a movement of the movable mass applies a mechanical stress to the second mechanical connector, wherein the electrical bias device is a DC voltage bias device and forms with at least the second mechanical connector a thermo-piezoresistive feedback electric circuit,
  wherein the first mechanical element is an anchoring pad secured to a support and the second mechanical element is a second anchoring pad secured to the support,
  and the movable mass is rotatably hinged with respect to the anchoring pad from a pivot hinge comprising two beams extending between the anchoring pad and the movable mass.

\* \* \* \* \*